INVENTOR
JAMES SAMUEL HAMLIN

BY William B. Cridlin, Jr.
ATTORNEY

INVENTOR
JAMES SAMUEL HAMLIN

BY William B. Cordlin, Jr.

ATTORNEY 3,359,879
Patented Dec. 26, 1967

3,359,879

VACUUM FRAME UTILIZING AIR INBLEED DURING EXPOSURE OF PHOTOSENSITIVE MATERIALS

James Samuel Hamlin, Cherry Hill, N.J., assignor to E. I. du Pont de Nemours and Company, Wilmington, Del., a corporation of Delaware Filed Apr. 13, 1965, Ser. No. 447,766
6 Claims. (Cl. 95—76)

This invention relates to apparatus useful in conjunction with the exposure of light-sensitive photopolymerizable layers. More particularly this invention relates to apparatus for preparing improved photopolymerized printing elements. Still more particularly it relates to such apparatus to control the amount of oxygen present during the exposure of flat and curved light-sensitive photopolymerizable layers.

Photopolymerizable elements useful for the preparation of printing reliefs are described in Plambeck U.S. Patents 2,760,863 and 2,791,504; Martin et al., U.S. Patent 2,927,022; and Burg U.S. Patent 3,036,913. The printing reliefs are generally prepared from these elements by a single exposure through a process transparency followed by a washout step. Prior to the exposure, the elements are generally sensitized to increase their speed, e.g., they are conditioned by being placed in an atmosphere of carbon dioxide for several hours. After this conditioning treatment, the element is exposed imagewise to a process transparency (photographic negative) to a light source having a high ultraviolet content. The conditions of exposure are such that substantial addition polymerization takes place in the exposed areas to form an insoluble, addition polymer and no significant polymerization takes place in the underexposed areas. The term "underexposed" is intended to cover the image areas which are completely unexposed or partially exposed, so that there is a material amount of the addition polymerizable compound still present and insufficient addition polymer image has been formed to bind the constituents. The underexposed image areas can be removed by solvent treatment (e.g., washed out with a solution of sodium hydroxide), leaving a relief formed by the insoluble exposed polymer.

For the exposure it is conventional to use high-intensity carbon arc and mercury vapor lamps in combination with flat or rotary exposure units. In these exposure devices a high vacuum condition is produced to maintain contact between the process transparency and the surface of the photopolymerizable element. This is usually accomplished by use of the conventional lithographic vacuum exposure frames.

Using the above means to produce halftone photopolymer printing plates has created some problems that affect the quality of the resulting plate. In particular, when exposing the photopolymerizable elements in the conventional vacuum frames to make halftone reliefs, some of the resulting printing plates did not print as high a quality of image as expected due to the plugging of the shadow and midtone wells of the plate. Shadow wells are the nonprinting areas in the area of the plate that prints the darkest portions of the original image. When these shadow wells are too shallow or of insufficient diameter, they fill in with ink and print what should be a non-printed area. For good quality printing of halftone images, there is a minimum depth that shadow wells must have for most papers and printing inks, i.e., on the order of 0.004 to 0.006 inch, and also a minimum diameter for the well, i.e., in the range of 0.0029 to 0.005 inch.

One of the causes of the plugging of the shadow wells is the swelling and fusing together of the barely insolubilized polymer (i.e., partially exposed polymer) lying along the walls of the shadow wells during the solvent washout operation. It has been found that this plugging can be cured or alleviated by adjustment of the concentration of oxygen in the top few mils of the polymerizable element during exposure. If the sensitivity of the top few mils is reduced during exposure, the resulting shadow wells are deep enough and have sufficient diameter for good printing. The most effective way to desensitize these top few mils is by the introduction of oxygen, e.g., atmospheric oxygen, at the surface of the element during exposure. If desensitization of the polymerizable element prior to exposure is attempted, other adverse effects are created, e.g., the exposure speed is reduced and undercutting of the polymer relief may result.

Additionally, it has been discovered that oxygen desensitization of the top few mils during exposure will produce smaller diameter high light dots and steeper side walls (near the top of the printing relief) thus resulting in better printing quality and longer plate life on the press.

Various methods of applying the phenomenon of oxygen desensitization have been tried, such as treating the surface of the photopolymerizable material with hydrogen peroxide immediately prior to exposure as disclosed in assignee's pending application, McGraw Ser. No. 218,455, filed Aug. 21, 1962, now Patent No. 3,168,404, or by pin holes in the vacuum frame cover sheet and the process transparency. However, these methods have practical limitations.

Accordingly, it is an object of this invention to provide apparatus for use while exposing light-sensitive photopolymerizable layers. Another object is to provide simple, dependable apparatus for use while exposing photopolymerizable layers to produce good quality printing plates. Another object is to provide exposure apparatus that will produce high quality halftone printing plates from photopolymerizable layers. It is another object to provide such apparatus that will allow a controlled amount of oxygen to be present during the exposure of photopolymer printing plates. Still another object is to provide such an apparatus which is useful during the exposure of flat or curved photopolymerizable elements. Yet another object is to provide apparatus that can be easily made by modification of existing exposure frames. Still further objects will be apparent from the following description of the invention.

These and other objects are accomplished by a vacuum apparatus for preparing an image-containing photopolymer element from an unexposed photopolymer element in contact with the matte surface of an image-bearing transparency which apparatus comprises (a) a backing support having two separate aperture areas on the same surface of said support, (b) vacuum means connected to one of said aperture areas of said support, (c) vacuum bleed means connected to the other aperture area of said support, and (d) means for hermetically sealing said aperture areas while said unexposed photopolymer element is held in contact with each of said aperture areas. This apparatus allows air only to flow into one of the aperture areas through the air bleed means. This slight flow of air passes between the surface of the unexposed photopolymer plate held in contact with the matte surface of the image transparency and then passes out through the vacuum means connected to the other aperture area.

The invention will now be described more fully with reference to the accompanying drawings which form a part of this application and wherein the same reference numbers refer to the same parts throughout the drawings. In the drawings.

Figure 1:
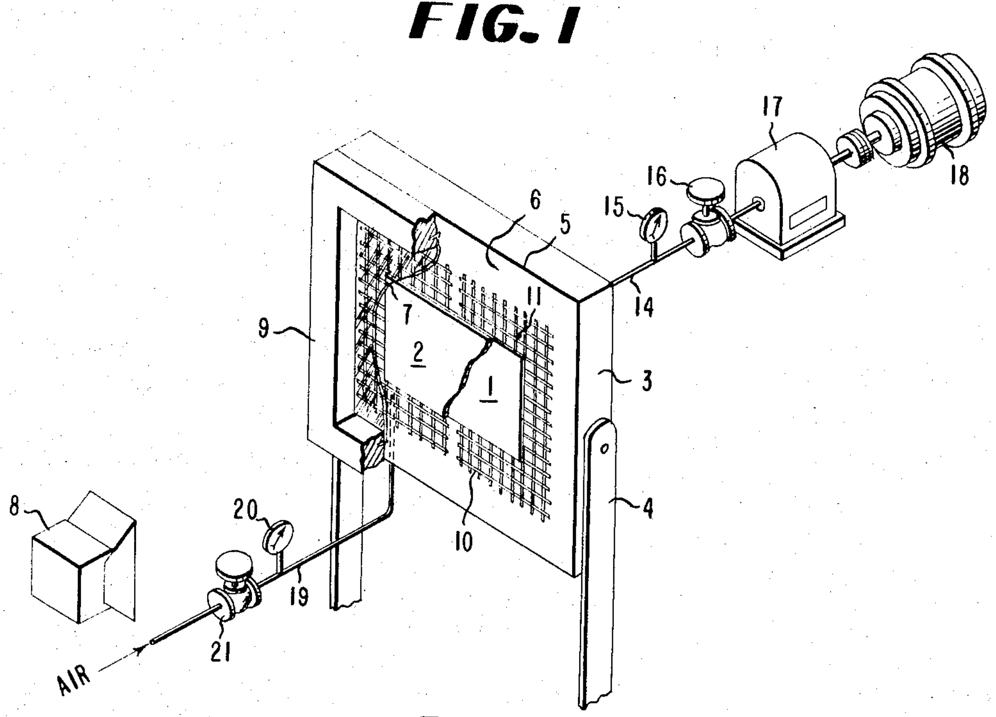
FIG. 1 is an isometric view with parts broken away of an embodiment of the invention as adapted for exposure of flat photopolymerizable elements.

In the embodiment of the invention shown in FIG. 1, which is useful during the exposure of flat photopolymerizable elements, a flat photopolymerizable element 1 having a process transparency 2, i.e., a photographic negative, positive, or a stencil, placed thereon is placed on a flat vacuum frame 3. The surface of the negative or stencil which is in contact with the photopolymerizable element has a matte finish to avoid optical contact, even after a vacuum has been applied. The vacuum frame is made of a base frame 4 and a backing surface or backing plate 5. As is conventional in the art, means can be provided such that the backing plate can be positioned either in a horizontal or a vertical plane, i.e., a "flip-flop" vacuum frame.

The system consisting of the front 6 of the backing plate, the process transparency 2 and the photopolymerizable element 1 is completely covered with a vacuum cover sheet 7 capable of transmitting actinic radiation from the source 8. The sheet can be made of a film of polyethylene, tetrafluoroethylene, a polyester as described in U.S. Patent 2,465,319, etc., since all of these films transmit ultraviolet light. Source 8 can be any radiation producing means that produces light rich in the ultraviolet region, such as a carbon arc lamp. The cover sheet 7 is clamped to the backing plate 5 by means of a frame 9.

Figure 2:
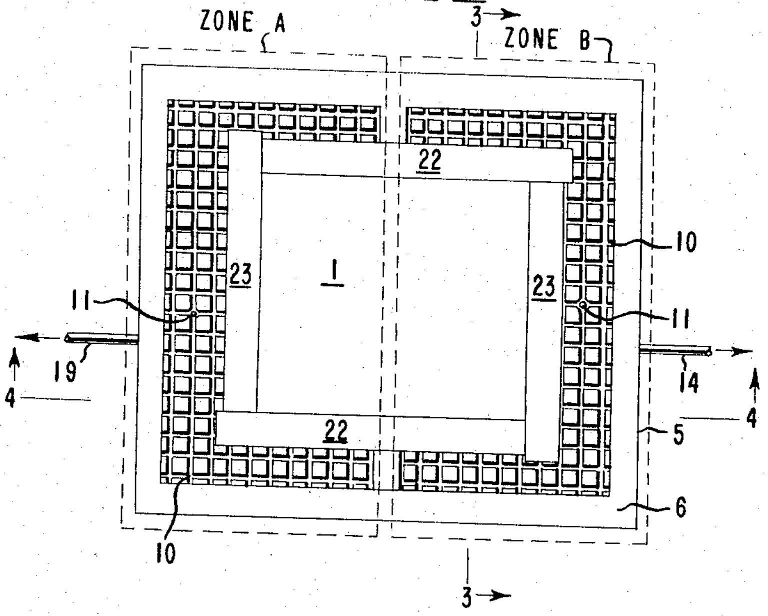
FIG. 2 is a front view of the backing plate of the embodiment of FIG. 1.
Figure 3:
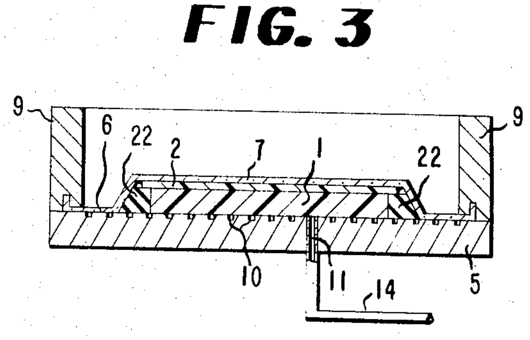
FIG. 3 is a sectional view taken along line 3—3 of FIG. 2 with a vacuum cover sheet in operational position.
Figure 4:
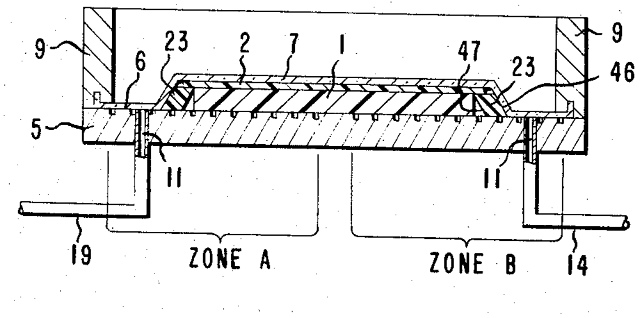
FIG. 4 is a sectional view taken along line 4—4 of FIG. 2 also with a vacuum cover sheet in operational position.

As better illustrated in FIG. 2 the front 6 of the backing plate 5 is provided with a series of grooves 10. Though it is preferable to use a series of interconnected grooves, the invention will also work when the apertures used are a plurality of unconnected openings in the front face of the backing plate, the openings leading into a chamber in the backing plate. The grooves of the preferred embodiment form part of the passageway for the flow of air when the exposure device is in operation. The grooves are divided into two distinct zones, zones A and B. As illustrated in FIG. 3 and FIG. 4, the grooves of each zone communicate with openings 11 and which are connected to suitable conduits. The grooves in zone B communicate with conduit or tubing 14 through holes 11 which the grooves of zone A communicate similarly with conduit 19. Thus, two distinct, separate systems of air passageways are provided. One of the zones, zone B in these figures although it could be either zone, communicates through suitable flexible tubing 14, with a vacuum gauge 15, a vacuum valve 16, and a vacuum pump or suction fan 17. The vacuum pump 17 is coupled to a motor drive 18 that will run the pump at the speed necessary to produce the desired vacuum. The other zone, zone A as illustrated in FIG. 4, communicates through suitable tubing 19 with another vacuum gauge 20 and to a controllable vacuum bleed valve 21.

The photopolymerizable element 1 is placed on the front of the backing plate 5 such that it is located partially in each zone. To insure that a sufficient seal will exist between the two zones once the vacuum is applied, along the sides of the element strips of compressible and essentially impermeable material 22 are placed such that they extend between the two zones, e.g., strips of rubber or soft plastic material. As the negatives 2 usually used to produce halftone plates are larger and extend over the photopolymerizable element, to provide a good seal and prevent the negative from sealing on the edge of the photopolymerizable element, negative support strips 23 are placed at the other two edges of the element 1. If the negative is smaller than the photopolymerizable layer, these strips 23 are not necessary. These strips can have a beveled side 46 so that a good seal will be obtained. The negative support strips 23 should be of the same height as the photopolymerizable element 1 and need not be compressible. If desired, the negative support strips 23 can have a beveled, serrated edge 47 adjacent the element to provide a passageway for the flow of air.

In operation, the element 1 is located on the front 6 of the backing plate 5 such that it is located partially in both zones. The sealing strips 22 and negative support strips 23 are then put into place and the process transparency is placed on the element, matte surface against the element. The cover frame 9 and cover sheet 7 are then lowered into operational position. Motor 18 is energized thus driving vacuum pump 17. Valve 16 is set to produce the desired vacuum, and the amount of vacuum is indicated on gauge 15. The air in the covered frame is then exhausted by being sucked through grooves 10, openings 11, and tubing 14 to the vacuum pump.

At the same time, vacuum bleed valve 21 is opened to the atmosphere to allow a slight flow of air into the system. This flow of air produces a lower level vacuum in zone A than in zone B. With this pressure differential, a slight flow of atmospheric air is forced to flow from zone A to zone B. Gauge 20 is used to indicate the amount of vacuum maintained in zone A. The invention can be modified to introduce pure oxygen or a mixture of gases including oxygen into the exposure frame rather than atmospheric air, however this is not necessary for most applications.

During the evacuation of air by pump 17, the cover sheet is brought into close contact with the front face 6 and the negative or stencil 2 on the photopolymerizable element 1. The sealing strips 23 have helped provide a good seal for the negative on the element and sealing strip 22 in conjunction with cover sheet 7 have provided a good seal between the two zones. The only area which is not essentially sealed is the space between the negative and the photopolymerizable element which is produced by the matte of the negative. It is through this space that the air can flow from zone A to zone B. This flow of air continues automatically throughout the exposure and provides the necessary oxygen to desensitize the top few mils of the element 1.

Figure 5:
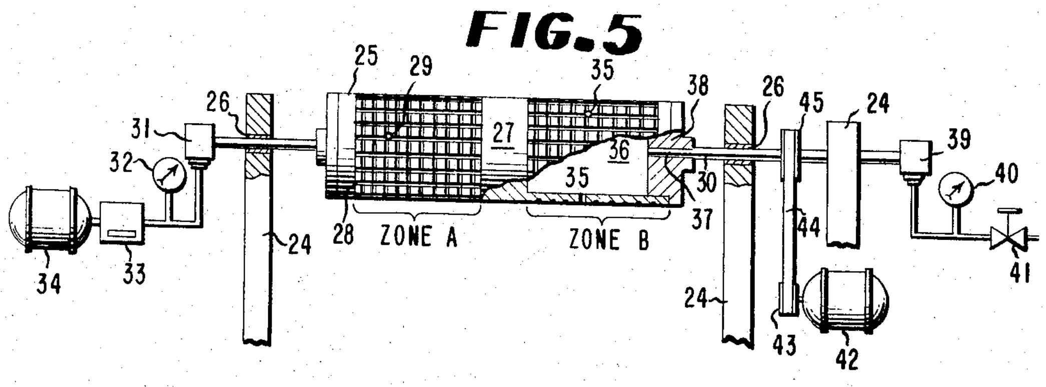
FIG. 5 is an elevated view of an embodiment of the invention as adapted for rotary exposure.

In another embodiment of the invention shown in FIG. 5, which is particularly useful during the exposure of curved photopolymerizable elements, the invention comprises a frame 24 into which a rotating exposure drum 25 is journalled 26. The front face 27 of the exposure drum 26 has a plurality of connected grooves 28; the grooves being divided into two distinct zones. The grooves in one zone communicate through openings 29 into a hollow compartment (not shown) in the drum, through a hollow shaft 30 to a rotary vacuum joint 31. This joint is connected to a vacuum gauge 32, and a vacuum pump 33 which is driven by a suitable motor 34.

The grooves 28 in the other zone communicate through similar openings 35 into a hollow compartment 36, and then through a conduit 37 in an end flange 38 into the hollow shaft 30. This hollow shaft communicates with another rotary vacuum joint 39 and then a vacuum gauge 40 and a vacuum bleed valve 41. The exposure drum 25 can be rotated during exposure by a motor 42 that is mechanically linked to the drum by a motor pulley 43, belt 44, and a shaft pulley 45 keyed to shaft 30.

The operation of the rotary unit is similar to that of the flat unit; the curved photopolymerizable element is placed on the drum, so that it is located partially in each zone. If necessary, various sealing strips are applied, so that the only flow of air during exposure will be between the matte surface of the negative and the photopolymer element. However, since the photopolymerizable element used in rotary exposure is very thin, no sealing strips are usually necessary. The negative is placed and taped on the photopolymerizable element, the cover sheet is applied, and the vacuum pump motor 34 is energized. Valve 41 is adjusted so that a lower level of vacuum is created in the zone of the exposure drum it controls, thus a slight flow of air between the two zones will be created. A suitable ultraviolet light source (not shown) is energized and the exposure drum is rotated, thus the exposure is made as the drum rotates. As with flat exposure, various methods may be used to collimate the actinic radiation to avoid too broad a printing character and dot slope in the plate.

The invention will now be illustrated by the following example which demonstrates the advantage of using the novel apparatus of the invention.

A photopolymerizable element made as described in Example 3 of Burg U.S. Patent 3,036,913 and having a layer thickness of 30 mils was exposed through a high-contrast negative having line and halftone images and also having a matte surface. The exposure was from a 140 ampere, Macbeth high intensity carbon arc, burning National Carbon Company High Intensity Photo Carbons, in a flat exposure frame such as illustrated in FIG. 1. The arc to plate distance was 30 inches and the exposure time was five minutes.

During the exposure a vacuum of 20–25 inches Hg was obtained and maintained in zone B while the vacuum of zone A was held at a level of 1–5 inches Hg by air bleed.

After washout by a pressurized water spray containing about 0.16 percent sodium hydroxide for six minutes, the printing element exhibited good image structure, deep shadow wells and a good printing surface. Printed halftone images from the above plate were of excellent quality.

A second exposure was made using a photopolymerizable element of the same composition, however during this exposure a conventional one zone, flat vacuum exposure frame was used. After washout, the printing element thus produced had some plugged midtone and shadow wells in the halftone relief and the printed image was not as good as that of the first exposure.

In some embodiments, if it is desirable to reverse the direction of the flow of air across the photopolymerizable element during exposure, the apparatus of the invention can be modified to produce this result. One method of doing this would be to connect both zones through a three way, solenoid operated valve to the vacuum source, and also connect both zones through additional conduits to the vacuum bleed through another three way, solenoid operated valve. Thus by energizing and de-energizing the solenoids the vacuum source and vacuum bleed can be switched to the different zones, respectively. If desired, the exposure device of the invention can be combined with the heat dissipating photographic apparatus disclosed in Hamlin U.S. Patent 3,087,402.

Many of the conventional lithographic exposure frames presently in use can be modified to operate in the same manner as the apparatus of the invention. These frames can be modified by plugging appropriate grooves of the existing grooves on the backing plate of the frame to provide two, distinct zones. Then the passageways or conduits and other vacuum devices previously described can be added to the existing frame.

The backing plate 5 is similar to that of the conventional vacuum frame and consists of a metal plate which is usually an aluminum plate because of its high heat conductivity. On the front face 6 are two distinct series of grooves about 1/16 inch wide and 1/16 inch deep which form a grid pattern of about 1 inch on centers, said grooves acting as air exhausting channels which are connected by suitable means to the source of air evacuation and air bleed. The surface of the metal plate of the frame should be made reflective to minimize the adsorption of infrared by the areas not covered by the negative and the printing plate being exposed. Any metal, e.g., magnesium, cast iron, stainless steel, copper, silver, can be used but aluminum is preferable because of ease of machining, high heat conductivity, light weight and high surface reflection to reduce the infrared adsorption. The thickness of the metal plate of the frame is not critical but is usually of the order of abut ½ inch. Metal plates of this thickness act as a heat "sink" which absorbs the heat from the negative and polymerizable plate being printed. Cover sheet 7 is a highly flexible, gas impervious, ultraviolet transmitting, infrared absorbing transparent film which adheres closely over the frame and seals the negative and printing plate in close planar relationship when vacuum is applied to the vacuum frame. The vacuum devices, i.e., gauges, valves, pump, etc., can be any of the commercially available conventional devices used in that art that satisfy the operational vacuum conditions.

In using the apparatus of the invention it was found that the best results were obtained when there was a maximum vacuum difference between the two zones and the vacuum on the low vacuum side (zone A) was maintained within the range of 1 inch Hg to 5 inches Hg and the vacuum of the high vacuum side (zone B) was within the range of 15 inches to 25 inches of Hg.

The radiation source used should furnish an effective amount of ultraviolet radiation. Suitable sources include carbon arcs, mercury-vapor arcs, fluorescent lamps with special ultraviolet-radiation-emitting phosphors, argon glow lamps, and photographic flood lamps. The point source carbon arc is preferred. The point radiation sources are generally used at a distance of 20 up to about 40 inches from the photopolymerizable element. Broad radiation sources can be used at a distance up to 24 inches from the photopolymerizable surface. The distance may vary, however, depending on the strength of the radiation source and the time required for exposure.

The photographic negative or positive, or the stencil, etc., used as the process transparency must have a slight matte surface to permit the flow of air between it and the photopolymerizable element. Suitable matte surfaces are described in Webster U.S. Patent 2,626,867.

In using the invention, practically any photopolymerizable sheet can be exposed with the apparatus of the invention. Suitable photopolymerizable compositions, sheets and base plates or supports are disclosed in Plambeck U.S. Patents 2,760,863 and 2,791,504; Martin U.S. Patents 2,927,022; 2,927,023; and 2,902,365; Barney U.S. Patent 2,448,611; Burg U.S. Patent 3,036,913; Saner and Burg U.S. Patent 2,972,540; Munger U.S. Patent 2,923,673; Smith U.S. Patent 3,012,952; Jennings U.S. Patent 3,036,914; Nottley 3,036,915; Barney et al., 3,046,127 and other patents.

The basic advantage of the invention is that it allows a controlled amount of oxygen to be present at the surface of a photopolymerizable element during exposure, and as a result makes it possible to have deeper shadow wells and improved dot shape in the resulting photopolymer printing plate. The apparatus of the invention is easy to construct, inexpensive, dependable, and produces high quality letterset and letter press printing plates that have long press life.

The invention apparatus is useful during the exposure of photopolymerizable elements, either flat or curved. The printing reliefs made in accordance with this invention can be used in all classes of printing but are most applicable to those classes of printing wherein a distinct difference of height between printing and nonprinting areas is required. These classes include those wherein the ink is carried by the raised portion of the relief such as in dry-offset printing and ordinary letterpress printing, the latter requiring greater height differences between printing and non-printing areas and those wherein the ink is carried by the recessed portions of the relief such as in intaglio printing, e.g., line and inverted halftone. The plates are useful for multicolor printing.

The invention is not limited to the exposure of photopolymerizable compositions to produce printing elements, it is also useful in the production of photoresists for etching, gravure, matrices for printing mattes, screens for "silk screens," ornamental plaques, foundry molds, cutting and stamping dies, relief maps, for embossing plastic, in the preparation of printed circuits and other photopolymer articles where oxygen desensitization of the surface of the photopolymerizable element during exposure is helpful. While the invention has been desrcribed with respect to certain particular arrangements, it will be evident that various changes and modifications may be made without departing from the scope and spirit of the invention.

What is claimed is:

1. A vacuum apparatus for preparing an image-containing photopolymer element from an unexposed photopolymer element in contact with the matte surface of an image-bearing transparency which apparatus comprises (a) a backing support having two separate aperture areas on the same surface of said support, (b) vacuum means connected to one of said aperture areas of said support, (c) vacuum bleed means connected to the other aperture area of said support, and (d) means for hermetically sealing said aperture areas while said unexposed photopolymer element is held in contact with each of said aperture areas, thereby allowing air passage control between said aperture areas utilizing said vacuum means and said vacuum bleed means.

2. A vacuum apparatus as defined in claim 1 where said hermetical means includes a frame to engage the outer periphery of said support surface and a film held by said frame to cover said support surface, said film being impervious to air and capable of passing the radiation necessary to expose said photopolymer.

3. A vaccum apparatus as defined in claim 1 where said backing support comprises a cylindrical member with said two aperture areas being on the outer surface of said cylinder.

4. A vacuum apparatus as defined in claim 1 where said aperture areas comprise multiple intersecting grooves in the surface of said support.

5. A vacuum apparatus for preparing an image-containing photopolymer element from an unexposed photopolymer element in contact with the matte surface of an image-bearing transparency which apparatus comprises (a) means for producing actinic radiation, (b) a backing support having on the same surface of said support two separate areas with multiple intersecting grooves, (c) vacuum means connected to one of said groove areas of said support, (d) vacuum bleed means connected to the other groove area of said support, (e) a frame adapted to engage the outer periphery of said support surface, and (f) a cover held by said frame for hermetically sealing said grooved areas while said unexposed photopolymer element is held in contact with each of said grooved areas for exposure to said actinic radiation through said transparency said cover being impervious to air and capable of passing the radiation from said light source.

6. A vacuum apparatus for preparing an image-containing photopolymer element from an unexposed photopolymer element in contact with the matte surface of an image-bearing transparency which apparatus comprises (a) means for producing actinic radiation, (b) a cylindrical back support having on the outer wall two separate areas having multiple intersecting grooves, (c) vacuum means connected to one of said groove areas of said support, (d) vacuum bleed means connected to the other groove area of said support, (e) a cover for hermetically sealing said grooved areas while said unexposed photopolymer element is held in contact with each of said grooved areas for exposure to said actinic radiation through said transparency said cover being impervious to air and capable of passing the radiation from said light source, and (f) drive means for rotating said cylindrical support.

References Cited

UNITED STATES PATENTS

| | | | |
|---|---|---|---|
| 2,895,796 | 7/1959 | Blatherwick | 248—363 |
| 2,919,635 | 1/1960 | Levine et al. | 95—76 X |
| 2,933,014 | 4/1960 | Anander | 88—24 |
| 2,956,769 | 10/1960 | Sigler et al. | 95—76 X |
| 2,988,979 | 6/1961 | Sigler | 95—76 |
| 3,107,078 | 10/1963 | Schutt | 248—363 |
| 3,229,953 | 1/1966 | Muir | 248—363 |

NORTON ANSHER, *Primary Examiner.*

M. H. HAYES, *Assistant Examiner.*